(12) United States Patent
Amid et al.

(10) Patent No.: US 9,299,032 B2
(45) Date of Patent: Mar. 29, 2016

(54) MULTI OBJECTIVE DESIGN SELECTION

(71) Applicant: International Business Machines Corporation, Armonk, NY (US)

(72) Inventors: David Amid, Kiryat Ata (IL); Ateret Anaby-Tavor, Givat Ada (IL); David Boaz, Bahan (IL); Ofer Shir, Jerusalem (IL)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 13/674,108

(22) Filed: Nov. 12, 2012

(65) Prior Publication Data

US 2014/0136460 A1    May 15, 2014

(51) Int. Cl.
G06N 99/00    (2010.01)

(52) U.S. Cl.
CPC .................... G06N 99/005 (2013.01)

(58) Field of Classification Search
CPC ..... G06K 99/00; G06F 2217/08; G06N 99/00
USPC ........................................................ 706/12
See application file for complete search history.

(56) References Cited

U.S. PATENT DOCUMENTS

2006/0271210 A1    11/2006    Subbu et al.

OTHER PUBLICATIONS

L Bui and S. Alam, "An Introduction to Multi-Objective Optimization", Multi-Objective Optimization in Computational Intelligence: Theory and Practice, 2008, pp. 1-19.*

M. Bittermann and I.S. Sariyidiz, "An Adaptive Multi-Objective Evolutionary Algorithm With Human-Like Reasoning for Enhanced Decision-Making in Building Design", IEEE Symp. on Computational Intel. in Multicriteria Decision-Making, pp. 105-112 (8 pages), 2011.*

G. Agrawal et al., "Intuitive Visualization of Hyperspace Pareto Frontier", AIAA Aerospace Sci. Meeting and Exhibit, 2006, pp. 1-14.*

J. Murata et al., "Multiple-Attribute Decision Making with Estimation of Preferences of Multiple Evaluators", SICE Annual Conf., 2010, pp. 1466-1471.*

Mattson et al., "Smart Pareto Filter: Obtaining a Minimal Representation of Multiobjective Design Space", Engineering Optimization 36(4), pp. 721-740, 2004.

Eskelinen and Miettinen, "Trade-off analysis approach for interactive nonlinear multiobjective optimization", OR Spectrum, Jul. 2011.

Parreiras et al., "Decision Making in Multiobjective Optimization Aided by the Multicriteria Tournament Decision Method", Nonlinear Analysis, Theory, Methods and Applications, vol. 71, No. 12, pp. e191-e198, Dec. 15, 2009.

(Continued)

*Primary Examiner* — Kakali Chaki
*Assistant Examiner* — Vincent Gonzales

(57) ABSTRACT

A method of selecting a group from a plurality of multi objective designs which comply with a plurality of objectives. The method comprises providing a plurality of multi objective designs, each the multi objective design having a plurality of multi objective design objective values which comply with at least one constraint of a Pareto Frontier of an objective space of a plurality of objectives, selecting a group from the plurality of multi objective designs, each member of the group is selected according to a match between at least one objective of respective the plurality of objectives and at least one of a respective gain threshold and a respective loss threshold, and outputting the group.

17 Claims, 4 Drawing Sheets

(56) References Cited

OTHER PUBLICATIONS

Taboada et al., "Data Mining Techniques to Facilitate the Analysis of the Pareto-Optimal Set for Multiple Objective Problems", 2006 IIE Annual Conference and Exposition, Institute of Industrial Engineers, 2006.

Venkat et al., "A Post-Optimality Analysis Algorithm for Multi-Objective Optimization", Computational Optimization and Applications, vol. 28, Issue 3, pp. 357-372, Sep. 2004.

* cited by examiner

MULTI OBJECTIVE DESIGN SELECTION

BACKGROUND

The present invention, in some embodiments thereof, relates to data and, more specifically, but not exclusively, to identification of solution points in an objective space.

Multi-objective Optimization, often referred to as Vector Optimization, strives at simultaneously optimizing multiple conflicting objective functions. Unlike single-objective optimization, which returns a single optimal solution that minimizes or maximizes the objective function, multi-objective optimization returns an optimal set, called the Pareto Frontier of the problem. The latter comprises the entire spectrum of solutions that satisfy a Pareto optimality condition so that: (1) every solution within the optimal set cannot be dominated by another solution (i.e., inferior in all objective function values) and/or (2) no solution is better than another in all the objective values. Thus, decision makers that are imposed with multi-objective problems and consequently choose to employ multi-objective optimization solvers are provided with an optimal set of solutions of which they eventually need to select a single solution. Since all the given solutions within the Frontier are optimal, the narrowing-down process is subjective.

SUMMARY

According to an aspect of some embodiments of the present invention there is provided a computerized method of selecting a group from a plurality of multi objective designs which comply with a plurality of objectives. The method comprises providing a plurality of multi objective designs, each said multi objective design having a plurality of multi objective design objective values which comply with at least one constraint of a Pareto Frontier of an objective space of a plurality of objectives and using a processor, a group from said plurality of multi objective designs, each member of said group is selected according to a match between at least one objective of respective said plurality of objectives and at least one of a respective gain threshold and a respective loss threshold.

According to an aspect of some embodiments of the present invention there is provided a system of selecting a group from a plurality of multi objective designs which comply with a plurality of objectives. The system comprises a processor, an input unit which acquires a Pareto Frontier of an objective space of a plurality of objectives, an objective multi objective design module which identifies a plurality of multi objective designs, each said multi objective design having a plurality of multi objective design objective values which comply with at least one constraint of said Pareto Frontier, and a design selection module which selects a group from said plurality of multi objective designs, each member of said group being selected according to a match between at least one objective of respective said plurality of objectives and at least one of a respective gain threshold and a respective loss threshold.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DETAILED DESCRIPTION

Figure 1:
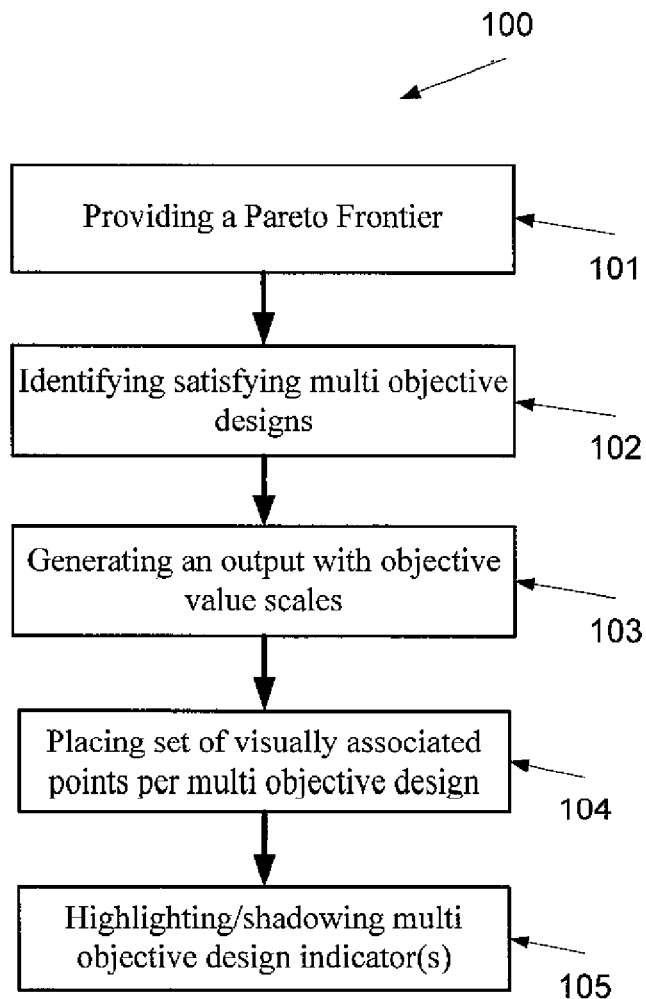
FIG. 1 is a flowchart of a method of a visualizing multi objective designs, such as Pareto optimal solutions, which comply with a plurality of objectives in an objective space in a single presentation, according to some embodiments of the present invention.

The present invention, in some embodiments thereof, relates to data and, more specifically, but not exclusively, to identification of solution points in an objective space.

According to some embodiments of the present invention, there are provided systems and methods of visualizing a plurality of multi objective designs, for example Pareto Frontier solution, by laying out, per design, sets of visually connected points (i.e. connected points) on objective scales. Optionally, the sets of visually connected points, namely the multi objective designs, are highlighted and/or shadowed according to existence of loss and/or gain patterns referred to herein also as loss/gain patterns. The loss and/or gain thresholds are optionally user defined.

The systems and methods allow user(s) to identify loss and/or gain patterns that account for significant gain and/or loss among objective values of each design and/or a number of designs.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Reference is now made to FIG. 1 which shows a method 100 of generating an output, for example for visualizing of a plurality of designs, such as Pareto optimal solutions, which comply with a plurality of objectives (e.g. objective functions) in an objective space in a single presentation, optionally static, that allows a user to review objective values of each design in relation to one another and in relation to respective objective values of other designs, according to some embodiments of the present invention.

Unlike commonly used processes wherein multi objective designs are filtered and/or selected manually, depending upon the decision maker's preferences and/or automatically on automated elimination of solutions based on their density, the method 100 allows generating a dataset that highlights objective values of preferred multi objective designs, for example a display and/or a table with data. This highlighting may be considered as recommending. The method 100 may be used to aid users in selection process, given Pareto Frontier solutions. As described below, the user may provide gain and/or loss significance thresholds. The highlighting may exhibit a specific tradeoff pattern between objective values.

Figure 4:
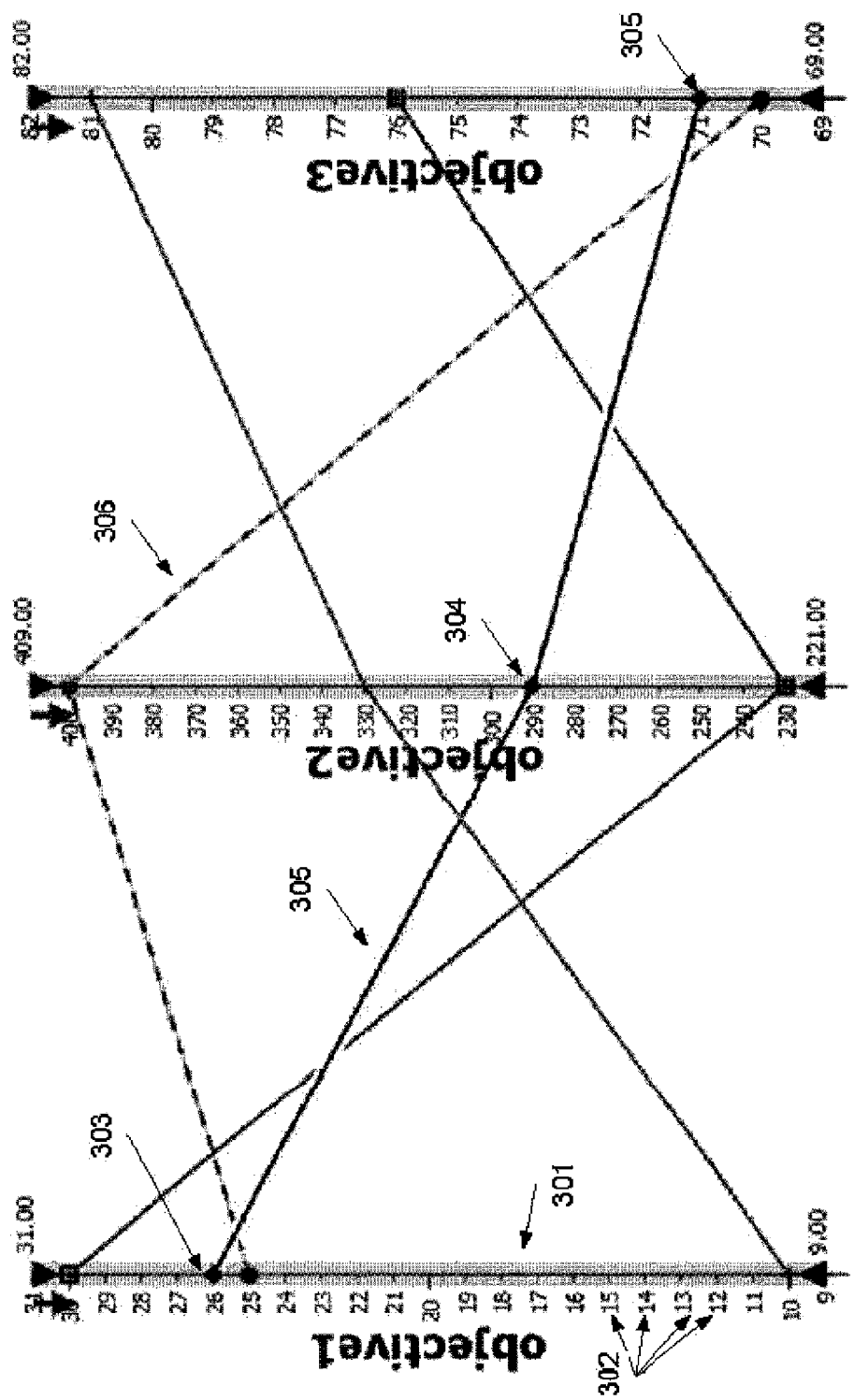
FIG. 4 is a parallel coordinates visualization instantiation of a display having a plurality of objective value scales, each corresponding with another of a plurality of objectives in an objective space and sets of visually associated points representing multi objective designs, according to some embodiments of the present invention.

In these embodiments, a presentation, which may be static or dynamic, for example parallel coordinates, for instance as depicted in FIG. 4, which is indicative of the objective values of each one of the designs may be automatically generated. For example, a colored column graph which maps designs in an objective space is created where each range of values per objective in the objective space is represented in the graph by an objective scale. As further described below, the presentation allows visualization of optimal designs, such as Pareto-Frontier design outcomes, in a manner that indicates, for each design, per objective, an objective value in relation to other objective values of the design and in relation to objective values of other designs. In such a manner, upon utilizing the current invention, the user can identify tradeoff patterns that account for significant tradeoff among objective values, for example gain and/or loss among objective values of each design and/or a number of designs. For example, the user may select designs based on identifying a desired correlation between a loss in one or more objective(s) and a gain in one or more other objective(s), a design wherein a limited loss in some objectives brings a substantial gain in the others.

Optionally, equal importance is set to each of the objectives. This requires identical or similar objective scales to allow equal visual interpretation by the user, e.g., by means of uniform normalization. The above outlined presentation, which is further described below, provides explicit representation of objective values of each design using a set of visually associated points. The visually associated points are indicative of objective values and lay out on respective objective scales (i.e. columns). The visually associated points may be connected by lines, for example as commonly utilized in Parallel Coordinates visualization and shown in FIG. 4, and/or visually associated by color and/or a common symbol.

Figure 3:
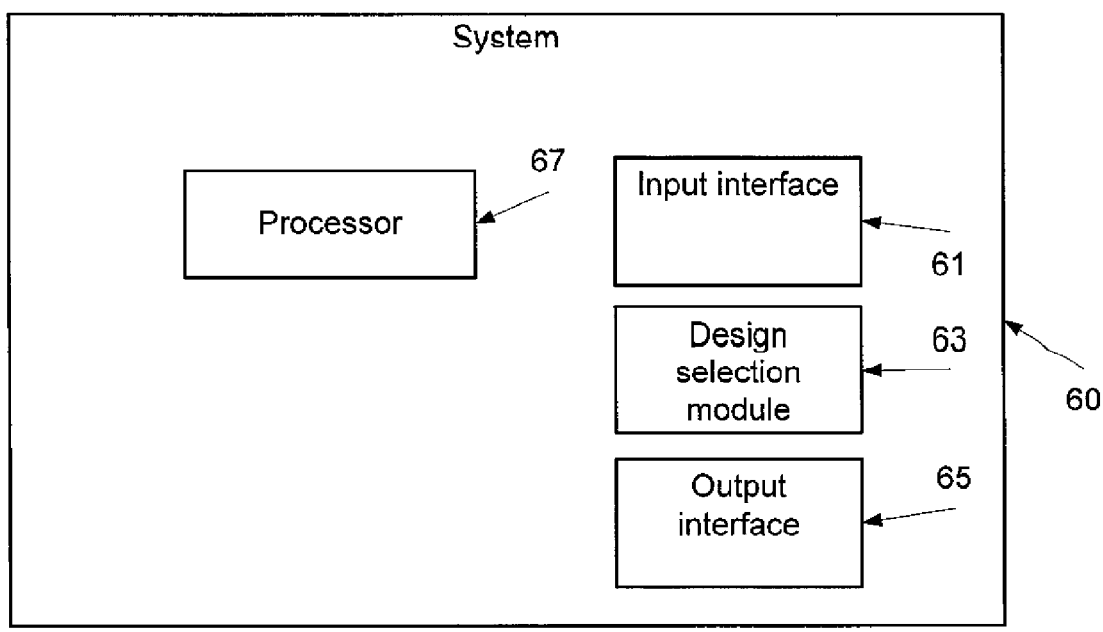
FIG. 3 is a relational view of software components of a system of visualizing in an objective space a plurality of designs that may be used for implementing the method depicted in FIG. 1, according to some embodiments of the present invention.

Reference is also made to FIG. 3, which is a relational view of software components of a system 60 of visualizing in an objective space a plurality of designs that may be used for implementing the above method 100, according to some embodiments of the present invention. As shown, the system 60 includes a processor 67 and following software and/or hardware components: as an input interface 61, a design selection module 63, and an output interface 65. The system 60 may be implemented in a client terminal hosting a design platform, for example as a feature of the design platform and/or an add-on thereto. The system 60 may be implemented in software as a service (SaaS) that is hosted centrally and accessed by users using a client module, such as a web browser, over the Internet or an Ethernet.

First, as shown at 101, a Pareto Frontier of an objective space of a plurality of objectives is provided, for example calculated and/or received, for example using the input interface 61. The Pareto Frontier optionally includes a spectrum of designs (e.g. solutions) that satisfy one or more constraint(s), for example the Pareto optimality condition(s) and possessing underlying loss and/or gain threshold pattern(s). Such pattern(s) reflect, per each design objective and according to an objective function in a pairwise comparison between two solution points, insignificant losses in certain objectives that are linked to significant gains in other objectives.

As shown at 102, multi objective designs with multi objective design objective values which satisfy the constraint(s) of the Pareto Frontier are identified, for example by design selection module 63. Optionally, the multi objective design objective values are filtered according to one or more selection conditions, for example based on user defined loss and gain thresholds, for instance as exemplified below.

This allows, as shown at 103 and as exemplified by FIG. 4, generating a display having a plurality of objective value scales 301, each corresponding with another of the plurality of objectives, for example by the display generation module 63.

As shown at 104, a set of visually associated points that represents each one of the multi objective designs in the display is placed. Each visually associated point is placed on a respective objective value scale to indicate another of the multi objective design objective values of the multi objective design in relation to. For example, in FIG. 4, which constitutes parallel coordinates visualization featuring highlighted solutions, a plurality of columnar scales 301 is displayed. Each columnar scale, such as 301, has a set of notches, such as 302. A set of visually associated points 303, 304, 305 is used for indicating objective values of each multi objective design (in this case—three). The layout of the visually associated points is indicative of objective values, for example based on proximate notches.

Optionally, as shown at 105, one or more multi objective design indicators, for example respective sets of points, are selected to be highlighted with respect to specific set of points that are then defined as their respective shadows. The highlighting and shadowing is optionally performed according to loss and/or gain pattern thresholds and/or weights which may be customized by the user for example using a graphical user interface (GUI). In such a manner, the display emphasizes which of the multi objective designs are more estimated to be suitable to meet the user's preferences.

Figure 2:
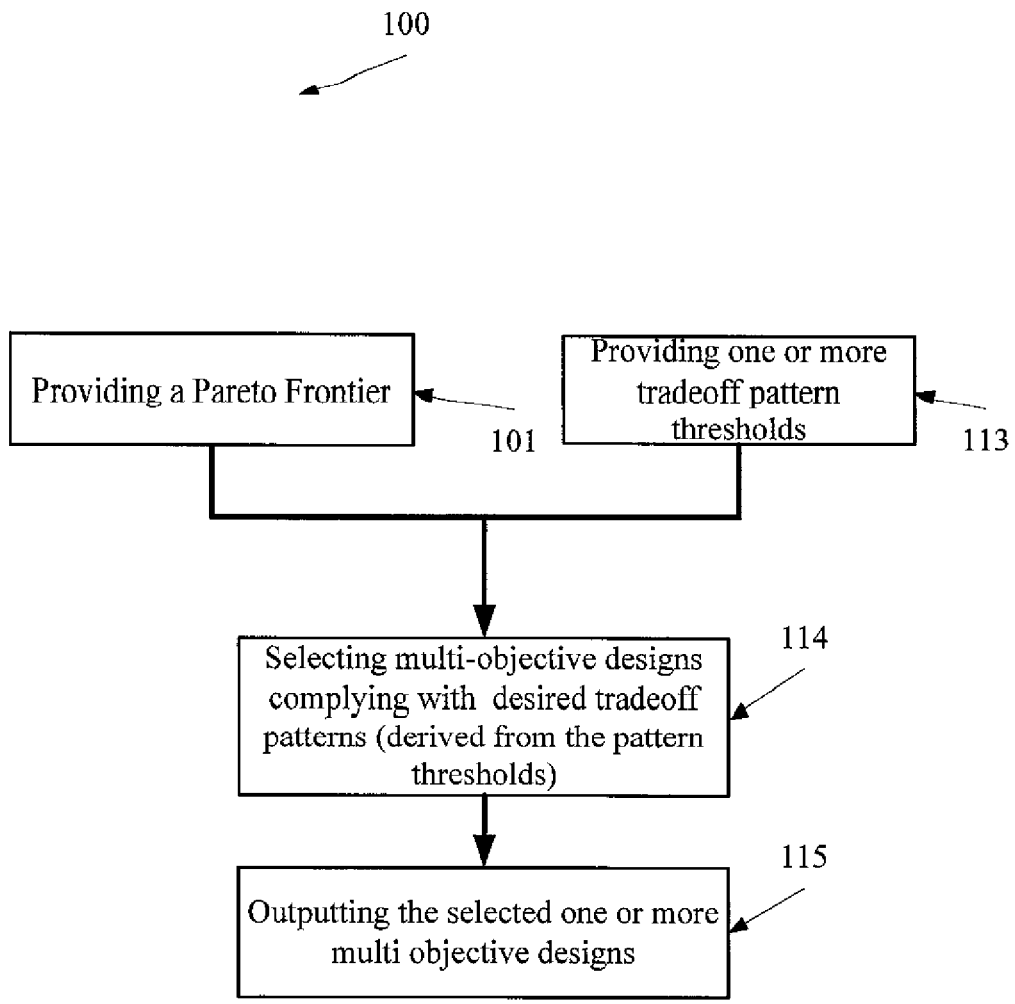
FIG. 2 is a flowchart of a method of selecting multi objective design(s) which comply with a plurality of objectives in an objective space using one or more loss and/or gain pattern thresholds, according to some embodiments of the present invention

Reference is also made to FIG. 2, which is a method 110 of selecting one or more of multi objective designs from a plurality of multi objective designs, for example Pareto optimal solutions, which comply with a plurality of objectives (e.g. objective functions) in an objective space using one or more loss and/or gain pattern thresholds, according to some embodiments of the present invention. 101 is as described above and depicted in FIG. 1; however, the method 110 further includes features 113, 114, and 115. In 113, one or more loss and/or gain pattern thresholds are defined, for example provided from a memory and/or set manually be a user. Then, as shown at 114, a set of one of multi objective designs from the multi objective designs which are identified according to a match with the loss and/or gain patterns. The selected multi-objective designs comply with desired tradeoff patterns (derived from the pattern thresholds). This allows generating a dataset that includes the designs, for example a table and/or a list. The selection may be according to a threshold that defines a desired and/or undesired correlation between a loss in one or more objectives and a gain in one or more other objectives and vice versa. The correlation may be provided at a ratio change.

For example, reference is now also made to a mathematical description of a selection process wherein a set of multi objective designs is selected to be highlighted and/or shadowed in a display. For brevity, highlighting and shadowing may be respectively used for describing actions such as selecting and concealing and/or filtering in and filtering out. First, for example as depicted in 101, an input a Pareto Frontier at the size of $\mu$, is received:

$$\{\vec{f}^{(i)}\}_{i=1}^{\mu}, \vec{f}^{(i)} \in \mathbb{R}^m,$$

This constitutes a set of minimal elements with respect to the partial order $\prec$:

$$\vec{f}^{(1)} \prec \vec{f}^{(2)} \Leftrightarrow \forall l \in \{1 \ldots m\} : f_l^{(1)} \leq f_l^{(2)} \wedge \exists l \in \{1 \ldots m\} : f_l^{(1)} < f_l^{(2)}.$$

The minimal elements are optionally indifferent to one another with respect to the partial order. Note that the problem may be formulated in terms of maximization relations without loss of generality.

Optionally, a gain vector $\vec{\delta}^{gain} \in \mathbb{R}_+^m$ is defined to represent a significant gain, optionally a user defined gain. The gain vector corresponds to the objective functions vector, that is, each of its coordinates relates to a specific objective function. Optionally, a loss vector $\vec{\delta}^{loss} \in \mathbb{R}_+^m$ is defined to represent an insignificant loss, optionally a user defined loss. Equivalently, the loss vector coordinates are defined per each objective function, respectively.

Additionally or alternatively, a default condition for selecting multi objective designs, for example for highlighting multi objective designs, is defined, optionally by a user. The condition optionally defines a pairwise comparison to be conducted in a double-loop fashion for selecting multi objective designs among the multi objective designs identified in 102. Optionally, selected multi objective designs are highlighted, referred to herein as highlighted multi objective designs, for example as shown at 305. Optionally, unselected multi objective designs are shadowed, referred to herein as shadowed multi objective designs, for example as shown at 306.

In one example, the default condition may be defined so that one multi objective design is selected over another (e.g. highlighted) if it possesses an insignificant loss in one or more of the respective objective functions, for example according to $\vec{\delta}^{loss}$, where at the same time it possesses a significant gain in one or more other objectives, for example according to $\vec{\delta}^{gain}$. Optionally, it is verified that the selected solution is not significantly inferior in comparison to the candidate shadowed solution in all its objectives (again with respect to $\vec{\delta}^{gain}$, playing the role of "significant loss"). When verified, the selected solution would be highlighted, whereas the other solution is added to a shadowed solution list that includes shadowed multi objective designs. The following is an exemplary pseudo code of highlighting and shadowing multi objective designs according to the above. Note that the pseudo code returns indices of a vector H of multi objective designs under examination that satisfies the prescribed logical expression:

---
Algorithm 1 The Basic Tradeoff Highlighter for Pareto Frontiers
---
input
- Pareto Frontier of size $\mu$: $\{\vec{f}^{(i)}\}_{i=1}^{\mu}$, $\vec{f}^{(i)} \in \mathbb{R}^m$
- gain/loss threshold vectors $\vec{\delta}^{loss}, \vec{\delta}^{gain} \in \mathbb{R}_+^m$
1:  initialize array of LinkedLists: $\mathcal{H}[1..\mu]$ =new LinkedList( )
2:  for i = 1 ... $\mu$ do
3:    for j = 1 ... $\mu$ do
4:      $\vec{\Delta} = \vec{f}^{(i)} - \vec{f}^{(j)}$
5:      if (any $(\vec{0} < -\vec{\Delta} \leq \vec{\delta}^{loss}) \wedge$ any $(\vec{\Delta} \geq \vec{\delta}^{gain}) \wedge$ all $(-\vec{\Delta} < \vec{\delta}^{gain}))$
        then
6:        $\mathcal{H}[j].add(\vec{f}^{(i)})$ {/* j is highlighted w.r.t. i */}
7:      end if
8:    end for
9:  end for
10: return $\mathcal{H}$ {/* highlight descriptors */}
---

Additionally or alternatively, a default condition may be defined to incorporate cumulative loss information. For example, the condition previously described may be tightened by demanding a cumulative normalized loss of a candidate selected solution with respect to a candidate shadowed solution should not exceed a prescribed threshold $\delta_0 \in \mathbb{R}_+$. Normalization may be carried out, for example with regard to $\vec{\delta}^{gain}$. For example, the following pseudo code is a possible realization of demanding a cumulative normalized loss:

---
Algorithm 2 The Cumulative Tradeoff Highlighter for Pareto Frontiers
---
input:
   Pareto Frontier of size $\mu$: $\{\vec{f}^{(i)}\}_{i=1}^{\mu}$, $\vec{f}^{(i)} \in \mathbb{R}^m$
   gain/loss threshold vectors $\vec{\delta}^{loss}, \vec{\delta}^{gain} \in \mathbb{R}_+^m$
   cumulative-loss threshold $\delta_0 \in \mathbb{R}_+$
1: initialize array of LinkedLists: $\mathcal{H}[1 \ldots \mu]$ =new LinkedList( )
2: for i = 1 ... $\mu$ do
3:   for j = 1 ... $\mu$ do
4:     $\vec{\Delta} = \vec{f}^{(i)} - \vec{f}^{(j)}$
5:     K = find $(\vec{\Delta} \geq \vec{\delta}^{gain})$ {/* a set of coordinates' indices */}
6:     if $$K \neq \emptyset \bigwedge \text{any}\left(\vec{0} < -\vec{\Delta} \leq \vec{\delta}^{loss}\right) \bigwedge \text{all}\left(-\vec{\Delta} < \vec{\delta}^{gain}\right) \bigwedge \sum_{l \notin K} \frac{-\Delta_l}{\delta_l^{gain}} < \delta_0$$

then
7:     $\mathcal{H}[j].add(\vec{f}^{(i)})$ {/* j is highlighted w.r.t. i */}
8:   end if
---
Algorithm 2 The Cumulative Tradeoff Highlighter for Pareto Frontiers
---
9:   end for
10: end for
11: return $\mathcal{H}$ {/* highlight descriptions */}
---

Reference is now made to a generalized instantiation of the above method where a matrix-based description of loss and gain thresholds is considered. In this embodiment, a complete pairwise threshold values for all objectives may be required. Optionally, loss and gain matrices, $\Lambda^{loss}, \Lambda^{gain} \in \mathbb{R}_+^{m \times m}$, are defined and a matrix element $\Lambda_{r,l}^{loss}$ defines the loss permitted at the $r^{th}$ objective, assuming a sufficient gain in the $l^{th}$ objective exists, as defined by the matrix element $\Lambda_{r,l}^{gain}$:

$$\Lambda^{loss} = \begin{pmatrix} -\infty & \Lambda_{1,2}^{loss} & \ldots & \Lambda_{1,m}^{loss} \\ \Lambda_{2,1}^{loss} & -\infty & \ldots & \Lambda_{2,m}^{loss} \\ \vdots & \vdots & \ddots & \vdots \\ \Lambda_{m,1}^{loss} & \ldots & \ldots & -\infty \end{pmatrix},$$

$$\Lambda^{gain} = \begin{pmatrix} +\infty & \Lambda_{1,2}^{gain} & \ldots & \Lambda_{1,m}^{gain} \\ \Lambda_{2,1}^{gain} & +\infty & \ldots & \Lambda_{2,m}^{gain} \\ \vdots & \vdots & \ddots & \vdots \\ \Lambda_{m,1}^{gain} & \ldots & \ldots & +\infty \end{pmatrix}$$

For example, the following pseudo code is a possible realization of a generalized matrix-based instantiation:

---
Algorithm 3 The Matrix-Based Tradeoff
Highlighter for Pareto Frontiers
---
input:
- Pareto Frontier of size $\mu$: $\{\vec{f}^{(i)}\}_{i=1}^{\mu}$, $\vec{f}^{(i)} \in \mathbb{R}^m$
- gain/loss threshold matrices $\Lambda^{loss}, \Lambda^{gain} \in \mathbb{R}_+^{m \times m}$
1    initialize array of LinkedLists: $\mathcal{H}[1..\mu]$ =new LinkedList( )
2:   for i = 1 ... $\mu$ do
3:     for j = 1 ... $\mu$ do
4:       $\vec{\Delta} = \vec{f}^{(i)} - \vec{f}^{(j)}$
5:       anySigGain=false, noSigLoss=true {/* boolean indicators */}
6:       for r = 1 ... m do
7:         K = find $(\vec{0} < \vec{\Delta} \leq \Lambda_{r,1..m}^{loss})$ {/* a set of coordinates' indices */}
8:         for l $\in$ K do
9:           if $\Delta_l \geq \Lambda_{r,l}^{gain}$ then
10:            anySigGain=true
11:          end if
12:          if $-\Delta_l \geq \Lambda_{r,l}^{gain}$ then
13:            noSigLoss=false
14:          end if
15:        end for
16:        if (anySigGain $\wedge$ noSigLoss) then
17:          $\mathcal{H}[j].add(\vec{f}^{(i)})$ {/* j is highlighted w.r.t, i */}
18:        end if
19:      end for
20:    end for
21:  end for
22:  return $\mathcal{H}$ {/* highlight descriptors */}
---

Optionally, regardless of the selection condition, the selection process terminates when a double-loop is over, and returns the selected multi objective designs, for example descriptors and/or indicators of solutions, optionally highlighted, and optionally their respective shadowed solutions.

Reference is now made to an exemplary selection feature featuring the following Pareto Frontier solutions:

$\vec{f}^{(1)} = (25, 400, 70)$ $\vec{f}^{(2)} = (30, 230, 76)$ $\vec{f}^{(3)} = (26, 290, 71)$ $\vec{f}^{(4)} = (10, 330, 81)$ where the following loss and/or gain pattern threshold values are defined:

$\vec{\delta}^{loss} = (2.0, 8.5, 0.5)$, $\vec{\delta}^{gain} = (10.0, 85.0, 5.0)$ When the above Algorithm 1 is applied on this exemplary dataset, the following vector is outputted:

$\mathcal{H} = [[\ ], [\ ], [\vec{f}^{(1)}], [\ ]]$,

This vector indicates that only solution number #3 is identified and/or highlighted with respect to solution number #1 due to significant gain in the 2$^{nd}$ objective and insignificant loss in the 1$^{st}$ objective. This outcome is depicted in FIG. 4.

The methods as described above are used in the fabrication of integrated circuit chips.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant methods and systems will be developed and the scope of the term a module, a processor, and a display is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A computerized method of selecting a group from a plurality of multi objective designs which comply with a plurality of objectives based on at least one user input, comprising:
    providing a plurality of multi objective designs, each said multi objective design having a plurality of multi objective design objective values which comply with at least one constraint of a Pareto Frontier of an objective space of a plurality of objectives;
    receiving at least one user input via a user interface presented by a client terminal;
    processing said at least one user input to determine at least one of a respective gain threshold and a respective loss threshold defining a tradeoff between at least some of said plurality of objectives; and
    automatically selecting, using a processor, a group from said plurality of multi objective designs, each member of said group is selected according to at least one of said respective gain threshold and said respective loss threshold;
    displaying a graphical representative having:
    a plurality of objective value scales each corresponding with one of said plurality of objectives, and a set of visually associated points per each one of said plurality of multi objective designs, each said visually associated point being placed to indicate another of a respective said plurality of multi objective design objective values in relation to a respective said objective value scale;
    wherein a respective said point associated with objective values of a member of said group is at least one of highlighted and shadowed in relation to other points associated with objective values of other of said plurality of multi objective designs.

2. The computerized method of claim 1, wherein said selecting is performed according to a match between said at least one objective and both said respective gain threshold and said respective loss threshold.

3. The computerized method of claim 1, further comprising outputting said group.

4. The computerized method of claim 1, further comprising shadowing at least one multi objective design in said display according to said selecting.

5. The computerized method of claim 1, wherein said shadowing comprising concealing at least one multi objective design in said display according to said selecting.

6. The computerized method of claim 1, further comprising highlighting at least one multi objective design in said display according to said selecting.

7. The computerized method of claim 1, wherein said tradeoff defines a correlation is a correlation between a loss in at least one first objective of respective said plurality of objectives and a gain in at least one second objective of respective said plurality of objectives.

8. The computerized method of claim 1, further comprising receiving said gain threshold and said loss threshold from a user.

9. The computerized method of claim 1, further comprising calculating at least one cumulative parameter by aggregating at least one of said gain threshold and said loss threshold of each said objective and using said at least one cumulative parameter for performing said selecting.

10. The computerized method of claim 1, wherein said selecting is performed by a pairwise comparison between pairs selected from of said plurality of multi objective designs.

11. The computerized method of claim 1, wherein said gain threshold and said loss threshold of said plurality of objectives are represented in a matrix form.

12. The computerized method of claim 1, wherein said tradeoff is between a cumulative normalized loss and a gain in at least one objective.

13. The computerized method of claim 1, wherein said tradeoff is between a cumulative normalized loss and a loss in at least one objective.

14. A non transitory computer readable medium comprising computer executable instructions adapted to perform the computerized method of claim 1.

15. A system of selecting and displaying a group from a plurality of multi objective designs which comply with a plurality of objectives based on at least one user input, comprising:
    an input unit which acquires a Pareto Frontier of an objective space of a plurality of objectives; and
    a memory storing a code;
    a processor adapted to execute a plurality of code instructions from said code, said plurality of code instructions comprising:
    code instructions for identifying a plurality of multi objective designs, each said multi objective design having a plurality of multi objective design objective values which comply with at least one constraint of said Pareto Frontier;
    code instructions for receiving at least one user input via a user interface presented by a client terminal;
    code instructions for processing said user input to determine at least one of a respective gain threshold and a respective loss threshold defining a tradeoff between at least some of said plurality of objectives; and
    code instructions for selecting automatically a group from said plurality of multi objective designs, each member of said group being selected according to at least one of said respective gain threshold and said respective loss threshold;
    code instructions for displaying a graphical representation having:
    a plurality of objective value scales each corresponding with one of said plurality of objectives, and
    a set of visually associated points per each one of said plurality of multi objective designs, each said visually associated point being placed to indicate another of a respective said plurality of multi objective design objective values in relation to a respective said objective value scale;
    wherein a respective said point associated with objective values of a member of said group is at least one of highlighted and shadowed in relation to other points associated with objective values of other of said plurality of multi objective designs.

16. A computer program product for visualizing a plurality of multi objective designs which comply with a plurality of objectives based on at least one user input, comprising:
    a non transitory computer readable storage medium;
    first program instructions to provide a plurality of multi objective designs, each said multi objective design having a plurality of multi objective design objective values which comply with at least one constraint of a Pareto Frontier of an objective space of a plurality of objectives;

second program instructions to receive at least one user input via a user interface presented by a client terminal;
third program instructions to process said at least one user input to determine at least one of a respective gain threshold and a respective loss threshold defining a tradeoff between at least some of said plurality of objectives; and
fourth program instructions to select automatically a group from said plurality of multi objective designs, each member of said group is selected according to at least one of said respective gain threshold and said respective loss threshold;
fifth program instructions to display a graphical representation having:
a plurality of objective value scales each corresponding with one of said plurality of objectives, and
a set of visually associated points per each one of said plurality of multi objective designs, each said visually associated point being placed to indicate another of a respective said plurality of multi objective design objective values in relation to a respective said objective value scale;
wherein a respective said point associated with objective values of a member of said group is at least one of highlighted and shadowed in relation to other points associated with objective values of other of said plurality of multi objective designs;
wherein said first, second, third, fourth, and fifth program instructions are stored on said non transitory computer readable storage medium.

17. The computer program product of claim 16, wherein said selecting is performed according to a match between said at least one objective and both said respective gain threshold and said respective loss threshold.

* * * * *